United States Patent
Namkung (10) Patent No.: US 9,685,620 B2
(45) Date of Patent: Jun. 20, 2017

(54) ORGANIC LIGHT EMITTING DIODE DISPLAY

(71) Applicant: SAMSUNG DISPLAY CO., LTD., Yongin, Gyeonggi-Do (KR)

(72) Inventor: Jun Namkung, Asan-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/804,465

(22) Filed: Jul. 21, 2015

(65) Prior Publication Data
US 2016/0211482 A1    Jul. 21, 2016

(30) Foreign Application Priority Data
Jan. 16, 2015    (KR) .................. 10-2015-0008148

(51) Int. Cl.
*H01L 51/52*        (2006.01)
*H01L 51/00*        (2006.01)

(52) U.S. Cl.
CPC ...... *H01L 51/0097* (2013.01); *H01L 51/5237* (2013.01); *H01L 51/5246* (2013.01); *H01L 51/5253* (2013.01); *H01L 2251/5338* (2013.01)

(58) Field of Classification Search
CPC ............ H01L 51/5253; H01L 27/3262; H01L 51/5246; H01L 51/5256; H01L 51/524; H01L 51/0096; H02L 27/3244; G02F 1/13454; G02F 1/134309; G02F 1/133345; G02F 1/13439; G02F 1/1362

See application file for complete search history.

(56) References Cited

U.S. PATENT DOCUMENTS

2006/0132030 A1* 6/2006 Gao .................... H01L 51/5237
                                                            313/511
2015/0380685 A1* 12/2015 Lee .................... H01L 51/5243
                                                            257/40
2016/0147109 A1* 5/2016 Yamazaki ......... G02F 1/133345
                                                            349/42

FOREIGN PATENT DOCUMENTS

| KR | 10-0967362 B1   | 7/2010  |
|----|-----------------|---------|
| KR | 10-2010-0130898 A | 12/2010 |
| KR | 10-2013-0026825 A | 3/2013  |
| KR | 10-2013-0118100 A | 10/2013 |

\* cited by examiner

*Primary Examiner* — Caridad Everhart
(74) *Attorney, Agent, or Firm* — Lee & Morse P.C.

(57) ABSTRACT

An organic light emitting device including a first region and a second region, the organic light emitting device including a flexible substrate; a driving circuit on the flexible substrate, the driving circuit including a thin film transistor; an organic light emitting element on the flexible substrate, the organic light emitting element connected to the driving circuit; an encapsulating thin film on the flexible substrate, the encapsulating thin film covering the organic light emitting element and the driving circuit; a first protection film facing the encapsulating thin film; a second protection film facing the flexible substrate in the first region; and a third protection film facing the flexible substrate in the second region, the third protection film having an elastic modulus that is less than an elastic modulus of the second protection film.

17 Claims, 7 Drawing Sheets

ORGANIC LIGHT EMITTING DIODE DISPLAY

CROSS-REFERENCE TO RELATED APPLICATION

Korean Patent Application No. 10-2015-0008148, filed on Jan. 16, 2015, in the Korean Intellectual Property Office, and entitled: "Organic Light Emitting Diode Display," is incorporated by reference herein in its entirety.

BACKGROUND

1. Field

Embodiments relate to an organic light emitting device.

2. Description of the Related Art

An organic light emitting diode display may be a self-luminance type of display device that may include a hole injection electrode and an electron injection electrode, and an organic light emitting diode display may be a self-emissive display device in which a hole injected from an anode and an electron injected from a cathode may be re-coupled with each other in the organic emission layer and dissipated to emit light.

SUMMARY

Embodiments may be realized by providing an organic light emitting device including a first region and a second region, the organic light emitting device including a flexible substrate; a driving circuit on the flexible substrate, the driving circuit including a thin film transistor; an organic light emitting element on the flexible substrate, the organic light emitting element connected to the driving circuit; an encapsulating thin film on the flexible substrate, the encapsulating thin film covering the organic light emitting element and the driving circuit; a first protection film facing the encapsulating thin film; a second protection film facing the flexible substrate in the first region; a first sealant between the encapsulating thin film and the first protection film; a second sealant between the flexible substrate and the second protection film; and a third protection film facing the flexible substrate in the second region, the third protection film having an elastic modulus that is less than an elastic modulus of the second protection film.

The second region may be a bent region.

The first region may be a flat region.

The elastic modulus of the third protection film may be less than 300 MPa.

The third protection film may be coated or laminated on the flexible substrate.

A neutral plane in the second region may be different from a neutral plane in the first region.

The neutral plane in the second region may be higher than the neutral plane in the first region.

The neutral plane in the second region may be on the first protection film.

The neutral plane in the first region may be in the flexible substrate or the driving circuit.

The first protection film may include a polarization film.

The second protection film may include a polyester.

The second sealant may include a pressure sensitive adhesive.

The third protection film may include multiple layers.

The third protection film may include multiple layers, and each of the multiple layers may have a different elastic modulus.

The third protection film may include a first layer; a second layer on the first layer; a third layer on the second layer; a fourth layer on the third layer; and a fifth layer on the fourth layer; and the flexible substrate may be on the fifth layer.

The elastic modulus of the third protection film may gradually increase when proceeding to the fifth layer from the first layer.

The elastic modulus of the third protection film may gradually decrease when proceeding to the fifth layer from the first layer.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawings, the thickness of layers, films, panels, regions, etc., may be exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

An organic light emitting device according to an exemplary embodiment will now be described with reference to FIG. 1 and FIG. 2.

Figure 1:
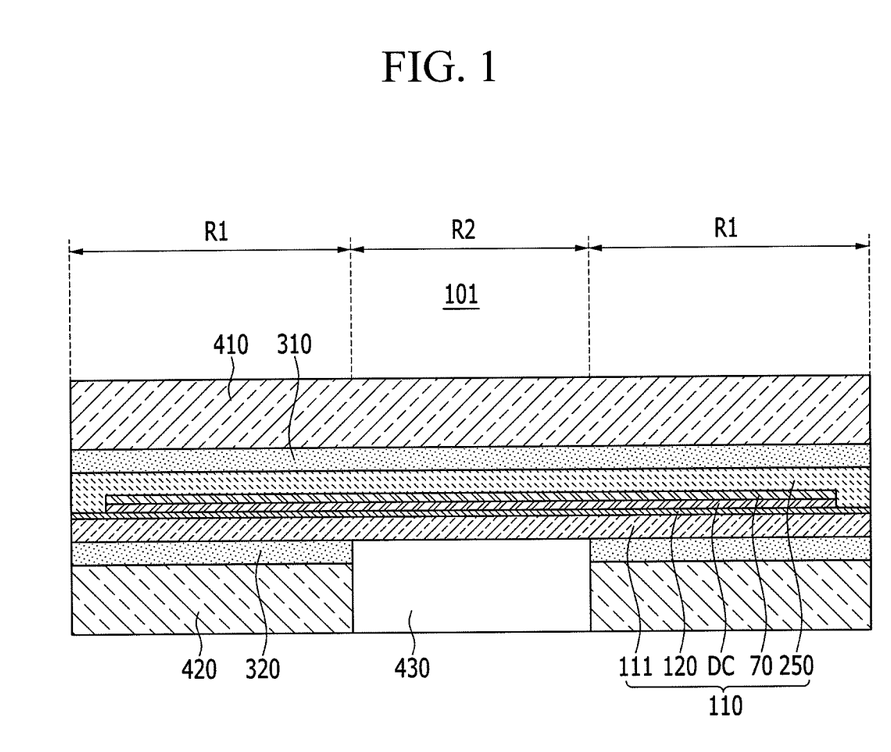
FIG. 1 illustrates a cross-sectional view of an organic light emitting device according to an exemplary embodiment.
Figure 2:
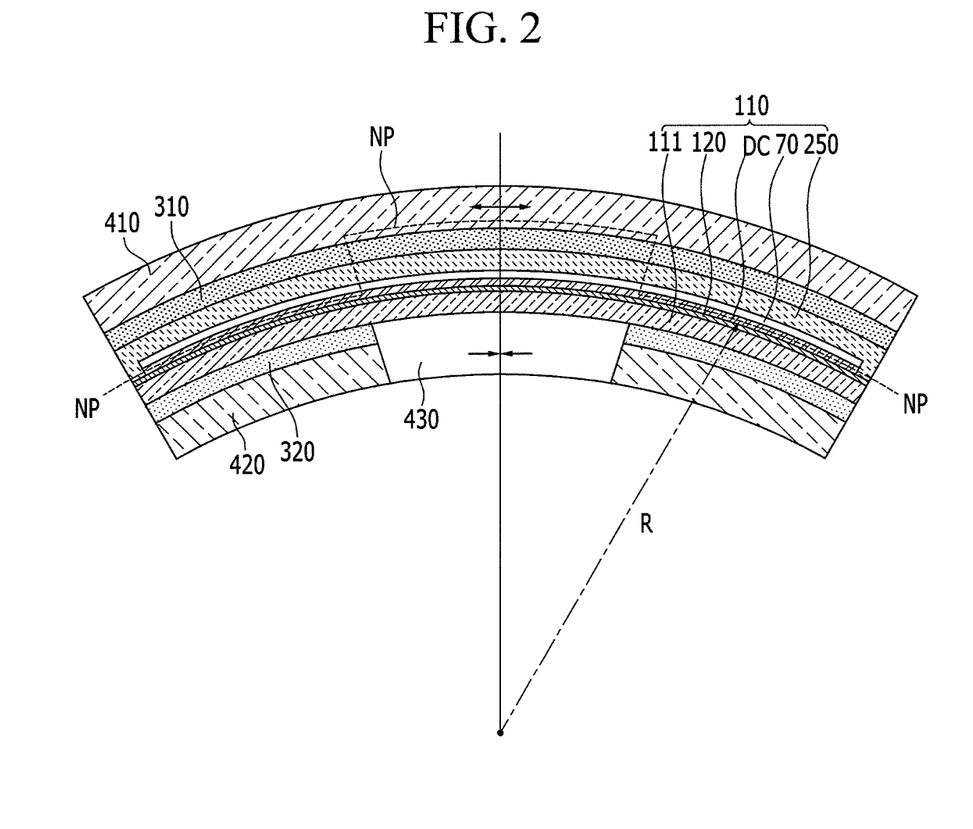
FIG. 2 illustrates a cross-sectional view of a bent organic light emitting device of FIG. 1.

FIG. 1 illustrates a cross-sectional view of an organic light emitting device according to an exemplary embodiment, and FIG. 2 illustrates a cross-sectional view of a bent organic light emitting device of FIG. 1.

As shown in FIG. 1, the organic light emitting device 101 may include a display panel 110, a first protection film 410, a first sealant 310, a second protection film 420, a second sealant 320, and a third protection film 430.

The display panel 110 may include a flexible substrate 111, a driving circuit (DC), an organic light emitting diode 70, and an encapsulating thin film 250.

The flexible substrate 111 may be made of a flexible plastic material. In an embodiment, the flexible substrate 111 may be formed of a metallic substrate of stainless steel. Various other flexible materials may also be used for the flexible substrate 111.

The driving circuit (DC) may include thin film transistors 10 and 20 (shown in FIG. 5), and the organic light emitting diode 70. The organic light emitting diode 70 may be connected to the driving circuit (DC), may emit light according to a driving signal provided by the driving circuit (DC), and may display an image.

Figure 5:
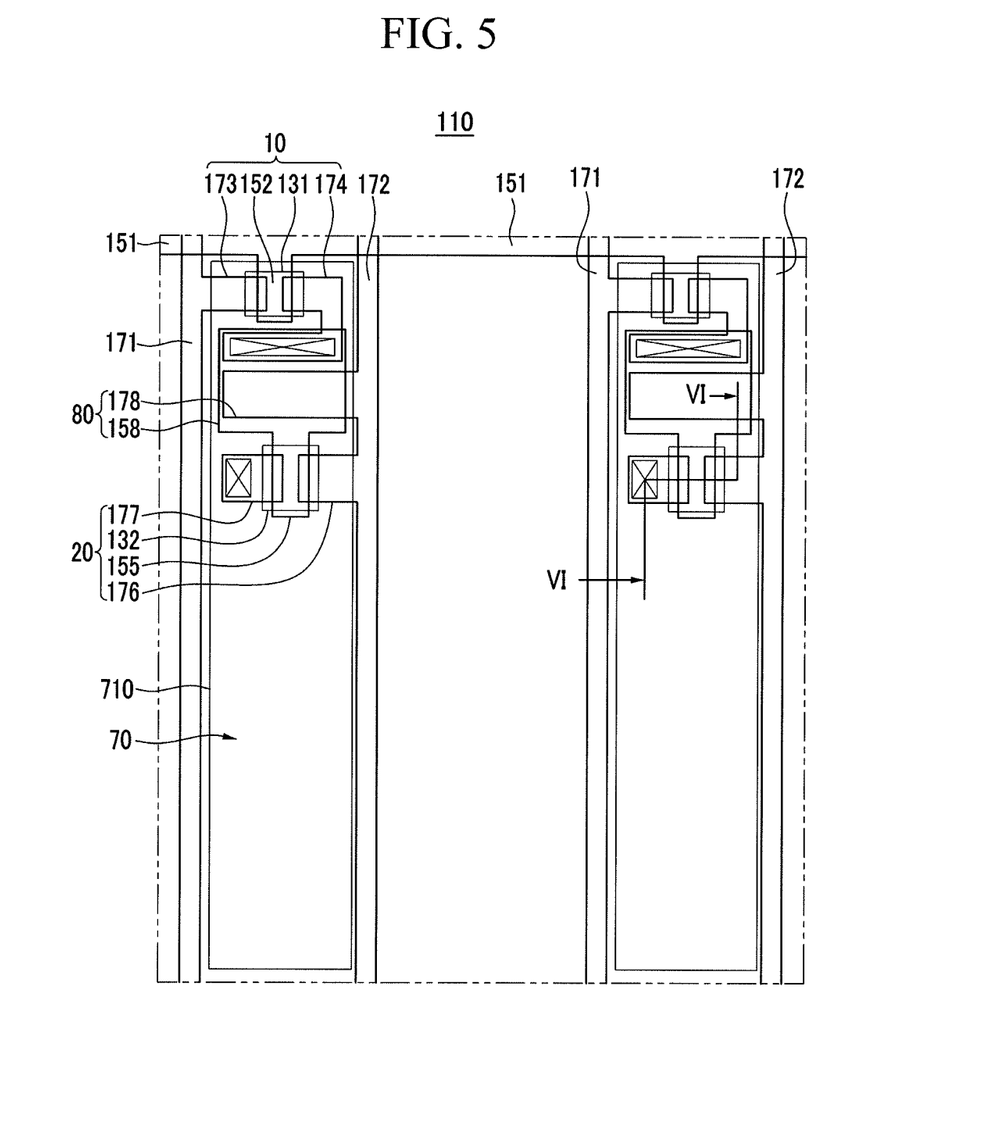
FIG. 5 illustrates a layout view of an internal configuration of a display panel of an organic light emitting device of FIG. 1.
Figure 6:
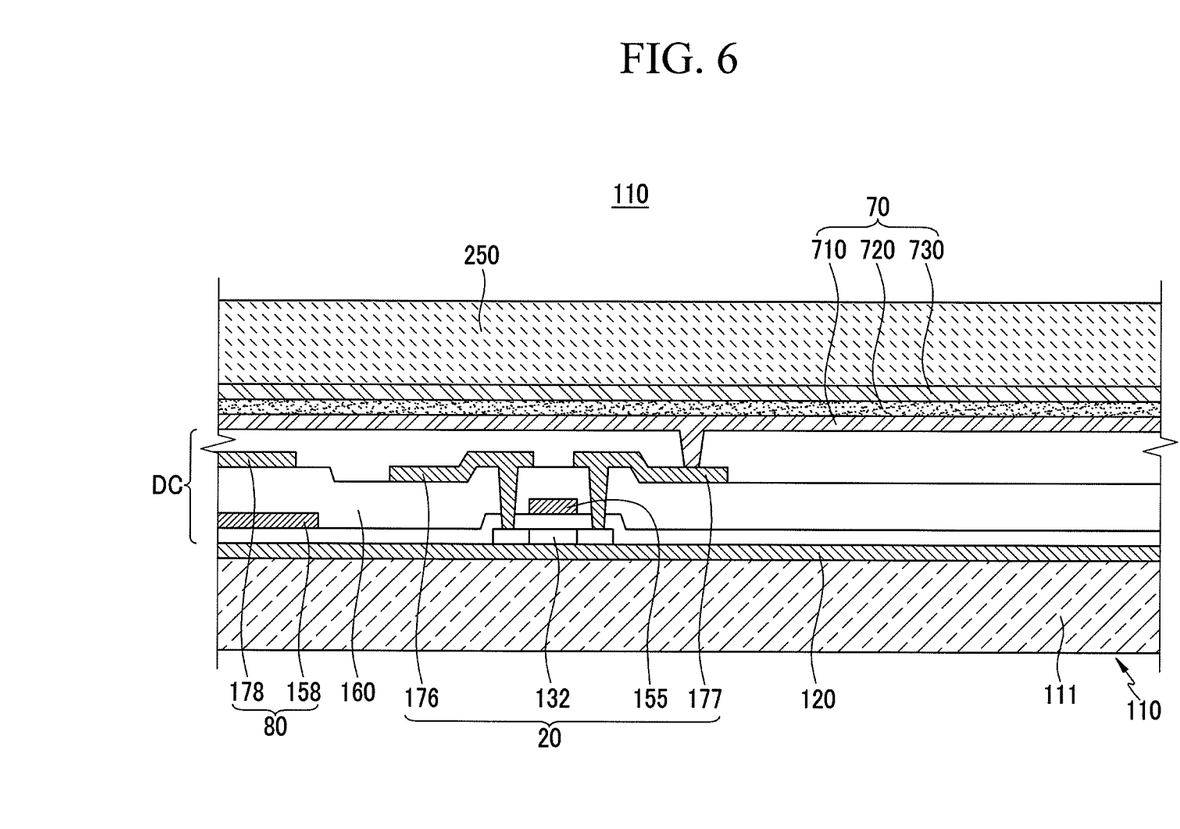
FIG. 6 illustrates a cross-sectional view with respect to a line VI-VI of FIG. 5.

Detailed exemplary configurations of the organic light emitting diode 70 and the driving circuit (DC) are shown in FIG. 5 and FIG. 6. In an embodiment, the organic light emitting diode 70 and the driving circuit (DC) may have various configurations.

The encapsulating thin film 250 may be formed with a multi-layered configuration. The encapsulating thin film 250 may be made of a plurality of inorganic layers or may be formed by combining an inorganic layer and an organic layer. According to the exemplary embodiment, the encapsulating thin film 250 may be formed by using various sorts of inorganic layers and organic layers.

The display panel 110 may further include a barrier layer 120 disposed between the flexible substrate 111 and the driving circuit (DC). The barrier layer 120 may be formed with at least one of various inorganic layers and organic layers. The barrier layer 120 may prevent an unnecessary component, such as moisture, from transmitting through the flexible substrate 111 and permeating into the organic light emitting diode 70. Moisture permeated into the organic light emitting diode 70 may shorten the lifespan of the organic light emitting diode 70.

The encapsulating thin film 250 and the barrier layer 120 may have a water vapor transmission rate (WWTR) that is less than 10-6 g/m²/day, and permeation of moisture into the organic light emitting element may be prevented.

The first protection film 410 may be arranged to face the encapsulating thin film 250. The first sealant 310 may be disposed between the first protection film 410 and the encapsulating thin film 250. The first protection film 410 may be attached to the encapsulating thin film 250 through the first sealant 310.

The second protection film 420 may be arranged to face the flexible substrate 111. The second sealant 320 may be disposed between the second protection film 420 and the flexible substrate 111. The second protection film 420 may be attached to the flexible substrate 111 through the second sealant 320.

The third protection film 430 may be arranged to face the flexible substrate 111.

The organic light emitting device 101 may be divided into a first region R1 and a second region R2. The first region R1 may be a flat region, and the second region R2 may be a bent region. The second protection film 420 may be provided in the first region R1, and the third protection film 430 may be provided in the second region R2.

The first protection film 410, the second protection film 420, and the third protection film 430 may improve mechanical rigidity of the display panel 110. The first protection film 410, the second protection film 420, and the third protection film 430 may be made of plastic, and may have a flexible characteristic in a like manner of the flexible substrate 111.

The first protection film 410 may be formed with a polarization film having a polarization function. Disposal of the protection film with a polarization function may be determined by a direction in which the organic light emitting diode 70 emits light. For example, when the organic light emitting diode 70 emits light in the direction of the first protection film 410 (i.e., top emission) to display an image, the first protection film 410 may be formed to have the polarization function. When the organic light emitting diode 70 emits light in the direction of the second protection film 420 and the third protection film 430 (i.e., bottom emission) to display an image, the second protection film 420 and the third protection film 430 may be formed to have the polarization function. When the organic light emitting diode 70 top-emits and bottom-emits, the first protection film 410, the second protection film 420, and the third protection film 430 may have the polarization function. The first protection film 410 and the second protection film 420 may not have the polarization function.

The second protection film 420 may be formed of a polyester (PET). In an embodiment, the second protection film 420 may be formed with various other materials.

The third protection film 430 may be formed with a material having a different elastic modulus from the second protection film 420. The third protection film 430 may have a smaller elastic modulus than the second protection film 420. For example, the elastic modulus of the second protection film 420 may be about 2 GPa to 4 GPa, and the elastic modulus of the third protection film 430 may be less than about 300 MPa.

The second sealant 320 may be made of a pressure sensitive adhesive (PSA). In an embodiment, the second sealant 320 may be formed with various other materials.

The display panel 110 excluding the flexible substrate 111 may be several micrometers thick, and the display panel 110 excluding the flexible substrate 111 may be folded or bent, e.g., in an undesirable manner. A comparative flexible substrate 111 may be several tens of micrometers thick, and it may be difficult to physically protect the organic light emitting diode 70 and the driving circuit (DC).

When the display panel 110 is used, portability may be worsened and the display panel 110 may be damaged. The first protection film 410, the second protection film 420, and the third protection film 430 may be attached to the display panel 110 to help improve mechanical rigidity of the display panel 110 and prevent damage to the display panel 110.

When the organic light emitting device 101 is bent, a tensile stress may be applied to an external side, e.g., an outer radius of curvature, with respect to a neutral plane (NP) and a compressive stress may be applied to an internal side, e.g., an inner radius of curvature, with respect to the neutral plane (NP), and the organic light emitting device 101 may shrink. The neutral plane (NP) refers to a side that does not increase or decrease but is bent while maintaining the original length when a bending momentum is applied. Arrows indicated by a solid line in FIG. 2 represent the tensile stress (←—→) and the compressive stress (→←) generated when the bending momentum is applied. The organic light emitting device 101 may be damaged when a stress is repeatedly applied or when a stress that is stronger than a breaking strength is applied to the organic light emitting device 101. The tensile stress or the compressive stress may become stronger when further from the neutral plane (NP). The breaking strength of the compressive stress may be approximately three times more robust than the breaking strength of the tensile stress.

In the first region R1, the neutral plane (NP) may be provided on the display panel 110. In the first region R1, the neutral plane (NP) may be provided on the flexible substrate 111 or the driving circuit (DC). For example, the neutral plane (NP) may be provided at a point a distance approximately 123 µm from a lowest side of the organic light emitting device 101 in the first region R1.

In the second region R2, when the neutral plane (NP) is provided on the flexible substrate 111 or the driving circuit (DC), a high tensile stress may be applied to the encapsulating thin film 250 when the second region R2 is bent, and the encapsulating thin film 250 may be damaged.

The third protection film 430 with an elastic modulus that is less than that of the second protection film 420 may be provided in the second region R2 of an organic light emitting device 101 according to an exemplary embodiment, and the neutral plane (NP) may be moved and the position of the neutral plane (NP) may rise. The neutral plane (NP) in the second region R2 may be different from the neutral plane (NP) in the first region R1, and the neutral plane (NP) in the second region R2 may be higher than the neutral plane (NP) in the first region R1, e.g., the neutral plane (NP) in the second region R2 may be closer to the external side than the neutral plane (NP) in the first region R1. The neutral plane (NP) may be provided on the first protection film 410 in the second region R2. For example, in the second region R2, the neutral plane (NP) may be provided at the point that is a distance approximately 143 µm from the lowest side of the organic light emitting device 101, the protection film with an elastic modulus that is lower in the first region R1 may be partly formed in the second region R2, and the position of the neutral plane (NP) may rise by approximately 20 µm. In the second region, the driving circuit (DC) and the encapsulating thin film 250 may be provided below the neutral plane (NP), and a compressive stress may be applied to the driving circuit (DC) and the encapsulating thin film 250.

As described, in the second region R2 that may be a bent region, the position of the neutral plane (NP) may rise further than in the first region R1, and the compressive stress rather than the tensile stress may be applied to the driving circuit (DC) and the encapsulating thin film 250. The breaking strength of the compressive stress may be greater than the breaking strength of the tensile stress, and rigidity of the second region R2 may be further improved. For example, when a bending force is applied to the second region R2, the second region R2 may be prevented from being damaged.

A method for manufacturing an organic light emitting device 101 of FIG. 1 will now be described with reference to FIG. 3 and FIG. 4

Figure 3:
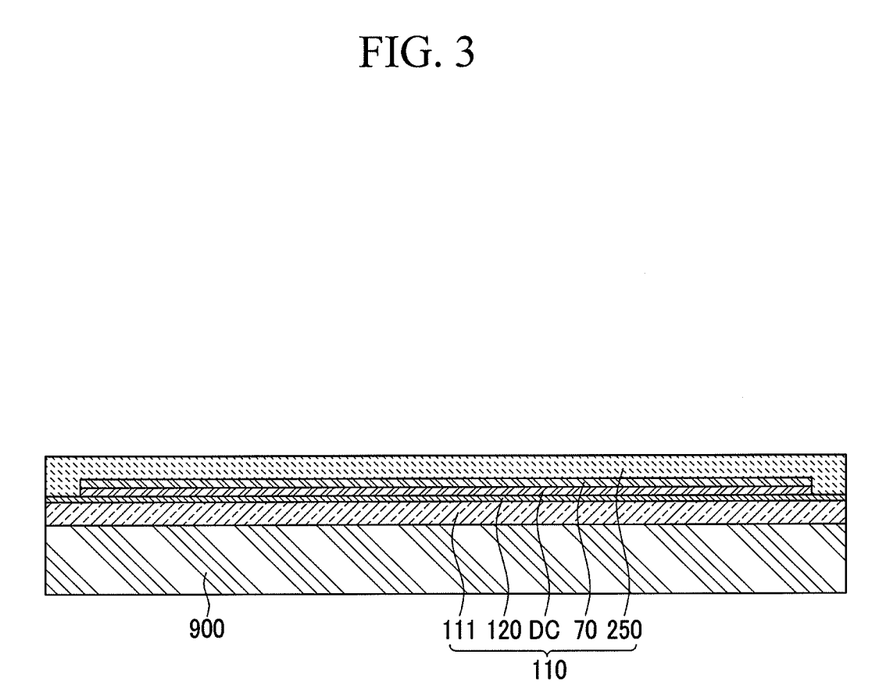
FIG. 3 and FIG. 4 illustrate cross-sectional views of part of a process for manufacturing an organic light emitting device of FIG. 1.
Figure 4:
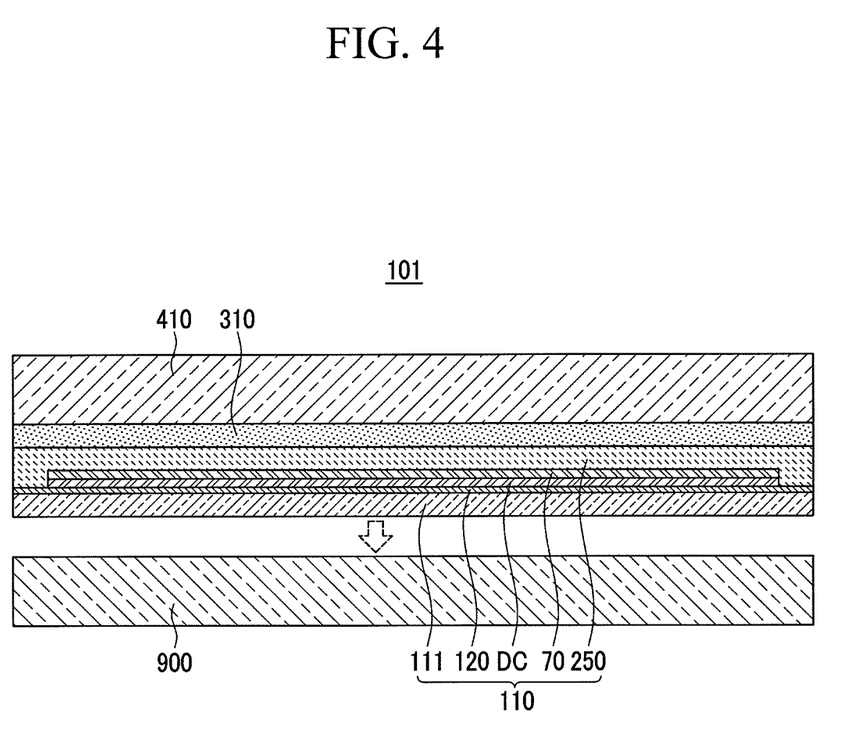

FIG. 3 and FIG. 4 illustrate cross-sectional views of part of a process for manufacturing an organic light emitting device of FIG. 1.

As shown in FIG. 3, a flexible substrate 111 may be formed on a glass substrate 900. The flexible substrate 111 may be made of a plastic with excellent thermal resistance and durability such as polyethylene ether phthalate, polyethylene naphthalate, polycarbonate, polyarylate, polyether imide, polyether sulfone, or polyimide.

The flexible substrate 111 that may be made of plastic may be bent or extended when applied with heat, and it may be difficult to form precise thin-film patterns such as various electrodes or conductive wires. Hence, the process for forming various sorts of thin-film patterns may be performed while the flexible substrate 111 is adhered to the glass substrate 900.

A barrier layer 120 may be formed on the flexible substrate 111, and a driving circuit (DC) and an organic light emitting diode 70 may be formed thereon. An encapsulating thin film 250 for covering the organic light emitting diode 70 and the driving circuit (DC) may be formed on the flexible substrate 111 to finish the display panel 110.

As shown in FIG. 4, a first protection film 410 may be attached to the encapsulating thin film 250 by use of a first sealant 310, and the glass substrate 900 may be separated from the flexible substrate 111.

A second protection film 420 may be attached to the flexible substrate 111 from which the glass substrate 900 may be detached by use of a second sealant 320. The second protection film 420 may be formed in the first region R1 and not in the second region R2.

A third protection film 430 may be formed on the flexible substrate 111 by using a coating scheme or a lamination scheme.

The second protection film 420 and the third protection film 430, which may have differing elastic moduli, may be formed in different regions on the flexible substrate 111, and the first region R1 may be strong, e.g., provide improved protection, against stabbing and the second region R2 may be strong, e.g., provide improved protection, against bending.

An internal configuration of the display panel 110 of the organic light emitting device 101 will now be described in detail with reference to FIG. 5 and FIG. 6.

FIG. 5 illustrates a layout view of a pixel configuration of a display panel 110, and FIG. 6 illustrates a cross-sectional view of a display panel 110 with respect to a line VI-VI of FIG. 5.

As shown in FIG. 5 and FIG. 6, the display panel 110 may include a switching thin film transistor 10, a driving thin film transistor 20, a capacitor 80, and an organic light emitting diode (OLED) 70 for each pixel. The switching thin film transistor 10, the driving thin film transistor 20, and the capacitor 80 may configure a driving circuit (DC). The display panel 110 may further include a gate line 151 disposed in a first direction, a data line 171 crossing the gate line 151 in an insulated manner, and a common power line 172. In an embodiment, one pixel may be defined by the gate line 151, the data line 171, and the common power line 172. The pixel may represent a minimum unit for displaying an image, and the display panel 110 may display the image through a plurality of pixels.

FIG. 5 illustrates an active matrix (AM) organic light emitting diode (OLED) display 101 of a 2 Tr-1 Cap structure in which one pixel may include two thin film transistors (TFT) and one capacitor. In an embodiment, the organic light emitting diode display 101 may be provided with three or more thin film transistors and two or more storage capacitors in one pixel, and may be configured to have various structures with additional wires.

The organic light emitting diode 70 may include a pixel electrode 710, an organic emission layer 720 formed on the pixel electrode 710, and a common electrode 730 formed on the organic emission layer 720. The pixel electrode 710 may be a positive (+) electrode, which may be a hole injection electrode, and the common electrode 730 may be a negative (−) electrode, which may be an electron injection electrode. In an embodiment, the pixel electrode 710 may be a negative electrode and the common electrode 730 may be a positive electrode depending on the method for driving the organic light emitting diode (OLED) display 101. Holes and electrons may be injected inside the organic emission layer 720 from the pixel electrode 710 and the common electrode 730. Exitons that are combinations of the injected holes and the electrons may enter the ground state from the exited state and the organic emission layer 720 may emit light.

Regarding the organic light emitting device 101 according to an exemplary embodiment, the organic light emitting diode 70 may emit light in the direction of the encapsulating thin film 250. For example, the organic light emitting diode 70 may be a top emission type. For the organic light emitting diode 70 to emit light in the direction of the encapsulating thin film 250, a reflective electrode may be used for the pixel electrode 710 and a transmissive or transflective electrode may be used for the common electrode 730. In an embodiment, the organic light emitting device 101 may be a bottom emission type or a dual emission type.

The capacitor 80 may include a pair of capacitive plates 158 and 178 disposed with an interlayer insulating layer 160 therebetween. The interlayer insulating layer 160 may be made of a dielectric material. Capacitance may be determined by charges stored by the capacitor 80 and a voltage between the capacitive plates 158 and 178.

The switching thin film transistor 10 may include a switching semiconductor layer 131, a switching gate electrode 152, a switching source electrode 173, and a switching drain electrode 174. The driving thin film transistor 20 may include a driving semiconductor layer 132, a driving gate electrode 155, a driving source electrode 176, and a driving drain electrode 177.

FIG. 6 illustrates the TFT with the top gate structure. In an embodiment, a thin film transistor with a bottom gate structure may be used. At least one of the switching semiconductor layer 131 and the driving semiconductor layer 132 may be an oxide semiconductor layer.

The switching thin film transistor 10 may be used as a switching element for selecting a pixel to emit light. The switching gate electrode 152 may be connected to the gate line 151. The switching source electrode 173 may be connected to the data line 171. The switching drain electrode 174 may be disposed to be separated from the switching source electrode 173 and may be connected to the capacitive plate 158.

The driving thin film transistor 20 may apply a driving power voltage for emitting the organic emission layer 720 of the organic light emitting diode 70 within the selected pixel to the pixel electrode 710. The driving gate electrode 155 may be connected to the capacitive plate 158 connected to the switching drain electrode 174. The driving source electrode 176 and the other capacitive plate 178 may be connected to the common power line 172. The driving drain electrode 177 may be connected to the pixel electrode 710 of the organic light emitting diode 70 through a contact hole.

With such a configuration, the switching thin film transistor 10 may operate by a gate voltage applied to the gate line 151 to transfer a data voltage applied to the data line 171 to the driving thin film transistor 20. A voltage corresponding to a difference between the common voltage applied from the common power line 172 to the driving thin film transistor 20 and the data voltage transferred to the switching thin film transistor 10 may be stored in the capacitor 80, a current corresponding to the voltage stored in the capacitor 80 may flow to the organic light emission element 70 via the driving thin film transistor 20, and the organic light emission element 70 may emit light.

As shown in FIG. 6, the encapsulating thin film 250 may be disposed on the organic light emitting diode 70 to help protect the organic light emitting diode 70 and the driving circuit (DC).

The barrier layer 120 may be formed on the flexible substrate 111. The barrier layer 120 may be formed with at least one of various inorganic layers and organic layers. The barrier layer 120 may prevent an unnecessary component, such as moisture, from transmitting through the flexible substrate 111 and permeating into the organic light emitting diode 70.

An organic light emitting device according to an exemplary embodiment will now be described with reference to FIG. 7.

The organic light emitting device according to an exemplary embodiment shown in FIG. 7 mostly corresponds to the organic light emitting device according to an exemplary embodiment described with reference to FIG. 1 to FIG. 6, and no descriptions thereof will be provided. The present exemplary embodiment differs from the previous exemplary embodiment in that the second protection film may be formed with multiple layers.

Figure 7:
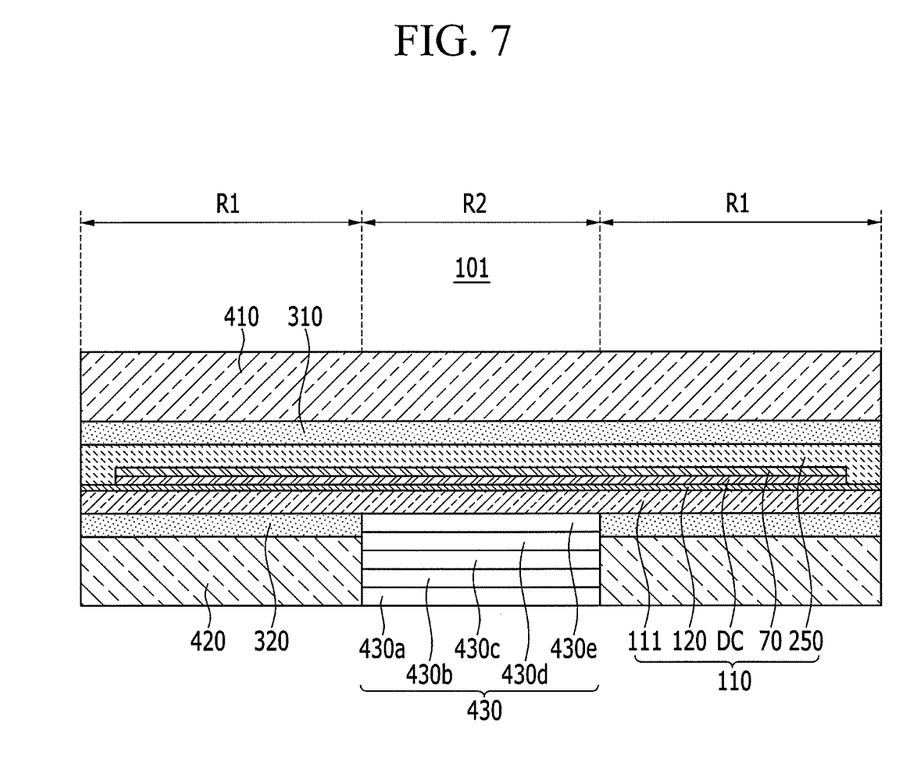
FIG. 7 illustrates a cross-sectional view of an organic light emitting device according to an exemplary embodiment.

FIG. 7 illustrates a cross-sectional view of an organic light emitting device according to an exemplary embodiment.

Referring to FIG. 7, the organic light emitting device 101 may include a display panel 110, a first protection film 410, a first sealant 310, a second protection film 420, a second sealant 320, and a third protection film 430. The display panel 110 may include a flexible substrate 111, a driving circuit (DC), an organic light emitting diode 70, and an encapsulating thin film 250.

The second protection film 420 may be arranged to face the flexible substrate 111 of the first region R1, and the third protection film 430 may be arranged to face the flexible substrate 111 of the second region R2. The third protection film 430 may have an elastic modulus that is lower than that of the second protection film 420.

The third protection film 430 may be configured with a single layer in the previous exemplary embodiment, and the third protection film 430 may be configured with multiple layers in the present exemplary embodiment. The third protection film 430 may be formed with multiple layers having different elastic moduli.

The third protection film 430 may include a first layer 430a, a second layer 430b provided on the first layer 430a, a third layer 430c provided on the second layer 430b, a fourth layer 430d provided on the third layer 430c, and a fifth layer 430e provided on the fourth layer 430d. A flexible substrate 111 may be provided on the fifth layer 430e.

The first layer 430a, the second layer 430b, the third layer 430c, the fourth layer 430d, and the fifth layer 430e may have different elastic moduli. The elastic moduli may gradually increase in order from the first layer 430a to the fifth layer 430e. In an embodiment, the elastic moduli may gradually decrease in order from the first layer 430a to the fifth layer 430e.

The third protection film 430 has been described to have five layers. In an embodiment, the third protection film 430 may have a number of layers that is greater or less than five.

By way of summation and review, since an organic light emitting diode display may have high-grade characteristics, such as low power consumption, high luminance, a wide viewing angle, and a high response speed, an organic light emitting diode display may be used in portable electronic devices.

If an OLED display device employs a glass substrate that is heavy and easily broken, there may be limitations in its portability and implementation of a large-scale screen display.

A flexible OLED display device, which may be light and resistant to impact, may include a flexible substrate such as plastic. Because such a flexible OLED display device may be folded or rolled, its portability may be maximized and utilized for various fields.

If a flexible OLED display device is excessively or repeatedly bent, an element such as a thin film transistor (TFT) may be damaged or conductive wiring may be disconnected.

Provided is an organic light emitting device that may improve rigidity of a bent portion.

The organic light emitting device according to the exemplary embodiment may improve rigidity by changing the tensile stress into a compressive stress by controlling the position of the neutral plane in the bent region.

Embodiments relate to an organic light emitting device that may improve rigidity on bending.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting device including a first region and a second region, the organic light emitting device comprising:
    a flexible substrate;
    a driving circuit on the flexible substrate, the driving circuit including a thin film transistor;
    an organic light emitting element on the flexible substrate, the organic light emitting element connected to the driving circuit;
    an encapsulating thin film on the flexible substrate, the encapsulating thin film covering the organic light emitting element and the driving circuit;
    a first protection film facing the encapsulating thin film;
    a second protection film facing the flexible substrate in the first region;
    a first sealant between the encapsulating thin film and the first protection film;
    a second sealant between the flexible substrate and the second protection film; and
    a third protection film facing the flexible substrate in the second region, the third protection film having an elastic modulus that is less than an elastic modulus of the second protection film, wherein
    the second and third protection films are under the flexible substrate.

2. The organic light emitting device as claimed in claim 1, wherein the elastic modulus of the third protection film is less than 300 MPa.

3. The organic light emitting device as claimed in claim 1, wherein the third protection film is coated or laminated on the flexible substrate.

4. The organic light emitting device as claimed in claim 1, wherein the first protection film includes a polarization film.

5. The organic light emitting device as claimed in claim 1, wherein the second protection film includes a polyester.

6. The organic light emitting device as claimed in claim 1, wherein the second sealant includes a pressure sensitive adhesive.

7. The organic light emitting device as claimed in claim 1, wherein the third protection film includes multiple layers.

8. The organic light emitting device as claimed in claim 1, wherein the third protection film includes multiple layers, and each of the multiple layers has a different elastic modulus.

9. The organic light emitting device as claimed in claim 1, wherein the second region is a bent region.

10. The organic light emitting device as claimed in claim 9, wherein the first region is a flat region.

11. The organic light emitting device as claimed in claim 1, wherein a neutral plane in the second region is different from a neutral plane in the first region.

12. The organic light emitting device as claimed in claim 11, wherein the neutral plane in the second region is higher than the neutral plane in the first region.

13. The organic light emitting device as claimed in claim 12, wherein the neutral plane in the second region is on the first protection film.

14. The organic light emitting device as claimed in claim 12, wherein the neutral plane in the first region is in the flexible substrate or the driving circuit.

15. The organic light emitting device as claimed in claim 1, wherein:
    the third protection film includes:
        a first layer;
        a second layer on the first layer;
        a third layer on the second layer;
        a fourth layer on the third layer; and
        a fifth layer on the fourth layer; and
    the flexible substrate is on the fifth layer.

16. The organic light emitting device as claimed in claim 15, wherein the elastic modulus of the third protection film gradually increases when proceeding to the fifth layer from the first layer.

17. The organic light emitting device as claimed in claim 15, wherein the elastic modulus of the third protection film gradually decreases when proceeding to the fifth layer from the first layer.

* * * * *